United States Patent
Nam et al.

(10) Patent No.: US 9,525,006 B2
(45) Date of Patent: Dec. 20, 2016

(54) STACKED TYPE IMAGE SENSOR INCLUDING COLOR SEPARATION ELEMENT AND IMAGE PICKUP APPARATUS INCLUDING THE STACKED TYPE IMAGE SENSOR

(71) Applicant: SAMSUNG ELECTRONICS CO., LTD., Suwon-si (KR)

(72) Inventors: Sunghyun Nam, Yongin-si (KR); Sookyoung Roh, Seoul (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/739,553

(22) Filed: Jun. 15, 2015

(65) Prior Publication Data
US 2015/0364521 A1    Dec. 17, 2015

(30) Foreign Application Priority Data
Jun. 13, 2014 (KR) .......................... 10-2014-0072293

(51) Int. Cl.
*H01L 27/146* (2006.01)
*G02B 5/20* (2006.01)

(52) U.S. Cl.
CPC ......... *H01L 27/14647* (2013.01); *G02B 5/201* (2013.01); *H01L 27/14603* (2013.01);
(Continued)

(58) Field of Classification Search
CPC .............. G02B 5/201; H01L 27/14603; H01L 27/14621; H01L 27/14625; H01L 27/14629; H01L 27/14634; H01L 27/14636; H01L 27/14646; H01L 27/14685
See application file for complete search history.

(56) References Cited

U.S. PATENT DOCUMENTS

| | | | | | |
|---|---|---|---|---|---|
| 5,764,389 | A | * | 6/1998 | Grinberg | ............... G02B 5/203 349/106 |
| 6,738,171 | B1 | * | 5/2004 | Campbell | .............. G02B 5/201 257/435 |

(Continued)

FOREIGN PATENT DOCUMENTS

| | | |
|---|---|---|
| JP | 2001-339057 A | 12/2001 |
| JP | 5325117 B2 | 10/2013 |

(Continued)

OTHER PUBLICATIONS

Communication issued Oct. 26, 2015, issued by the European Patent Office in counterpart European Patent Application No. 15171727.9.

(Continued)

*Primary Examiner* — Amy Hsu
(74) *Attorney, Agent, or Firm* — Sughrue Mion, PLLC

(57) ABSTRACT

A stacked type image sensor with improved optical characteristics, which may result from a color separation element, and an image pickup apparatus including this image sensor. The stacked type image sensor includes first and second light sensing layers arranged in a stacked manner, and color separation elements positioned between the first and second light sensing layers. Accordingly, the first light sensing layer absorbs and detects light of a first wavelength band, and the second light sensing layer detects light of second and third wavelength bands separated by the color separation elements.

20 Claims, 8 Drawing Sheets

(52) U.S. Cl.
CPC .. *H01L 27/14621* (2013.01); *H01L 27/14625* (2013.01); *H01L 27/14636* (2013.01); *H01L 27/14685* (2013.01); H01L 27/1469 (2013.01); H01L 27/14629 (2013.01); H01L 27/14634 (2013.01)

(56) References Cited

U.S. PATENT DOCUMENTS

| | | | |
|---|---|---|---|
| 8,101,903 B2* | 1/2012 | Mokhnatyuk | H01L 27/14621 250/226 |
| 8,258,560 B1* | 9/2012 | Hynecek | H01L 27/1461 257/292 |
| 8,384,818 B2* | 2/2013 | Hiramoto | H01L 27/14621 348/274 |
| 8,767,114 B2* | 7/2014 | Hiramoto | H01L 27/14621 348/294 |
| 8,941,200 B2* | 1/2015 | Egawa | H01L 27/1461 257/12 |
| 2009/0101953 A1 | 4/2009 | Hayashi et al. | |
| 2010/0019129 A1* | 1/2010 | Ishigaki | H01L 27/14621 250/208.1 |
| 2011/0050941 A1* | 3/2011 | Hiramoto | H01L 27/14625 348/222.1 |
| 2011/0164156 A1 | 7/2011 | Hiramoto et al. | |
| 2012/0212656 A1 | 8/2012 | Hiramoto et al. | |
| 2013/0099343 A1 | 4/2013 | Toshikiyo et al. | |
| 2013/0264467 A1* | 10/2013 | Hong | H01L 27/14609 250/208.1 |
| 2014/0078355 A1 | 3/2014 | Hiramoto et al. | |
| 2015/0015768 A1 | 1/2015 | Tanaka | |

FOREIGN PATENT DOCUMENTS

| | | |
|---|---|---|
| JP | 5564847 B2 | 8/2014 |
| KR | 10-2008-0105641 A | 12/2008 |
| KR | 10-2010-0052838 A | 5/2010 |
| WO | 2013/145433 A1 | 10/2013 |

OTHER PUBLICATIONS

Communication issued Mar. 2, 2016, issued by the European Patent Office in counterpart European Application No. 15171727.9.

Seiji Nishiwaki et al.; "Efficient Colour Splitters for High-Pixel-Density Image Sensors"; Nature Photonics; vol. 7; Mar. 2013; pp. 240-246; DOI: 10.1038/NPHOTON.2012.345.

* cited by examiner

STACKED TYPE IMAGE SENSOR INCLUDING COLOR SEPARATION ELEMENT AND IMAGE PICKUP APPARATUS INCLUDING THE STACKED TYPE IMAGE SENSOR

RELATED APPLICATION

This application claims the benefit of priority from Korean Patent Application No. 10-2014-0072293, filed on Jun. 13, 2014, in the Korean Intellectual Property Office, the disclosure of which is incorporated herein by reference in its entirety.

BACKGROUND

1. Field

An apparatus and a sensor consistent with exemplary embodiments broadly relate to a stacked type image sensor including a color separation element and an image pickup apparatus including the image sensor, and more particularly, to a stacked type image sensor having improved light use efficiency due to use of a color separation element, and an image pickup apparatus including the image sensor.

2. Description of the Related Art

Generally, color displays display multicolor images and color image sensors detect colors of incident light thereon by using color filters. Most of the currently used color displays or color image sensors use a RGB color filter scheme in which, for example, green filters are disposed to correspond to two of four pixels and blue and red filters are disposed to correspond to the other two pixels. In addition to the RGB color filter scheme, a CYGM color filter scheme in which complementary cyan, yellow, green, and magenta color filters are respectively disposed to correspond to four pixels is used.

However, since the color filters absorb all colors of light except for a filtered color, the light use efficiency of the color filters may be low. For example, since RGB color filters transmit only about ⅓ of incident light and absorb about ⅔ of the incident light, the light use efficiency of the RGB color filters is only about 33%. Therefore, most of the optical loss of the color displays or color image sensors is caused by the color filters.

SUMMARY

It is an aspect of exemplary embodiments to provide a stacked type image sensor that uses a color separation element and thus has an improved light use efficiency, and an image pickup apparatus including the image sensor thereof.

Additional aspects of exemplary embodiments will be set forth in part in the description of exemplary embodiments which follows and, in part, will be apparent from the description of exemplary embodiments, or may be learned from practicing exemplary embodiments.

According to an aspect of one or more of exemplary embodiments, an image sensor includes: a first light sensing layer including a plurality of first pixels absorbing light of a first wavelength band and transmitting light of other wavelength bands; a second light sensing layer positioned to face the first light sensing layer, the second light sensing layer including a plurality of second pixels detecting light of a second wavelength band from the transmitted other wavelength bands and a plurality of third pixels detecting light of a third wavelength band from the transmitted other wavelength bands; and a plurality of color separation elements positioned between the first light sensing layer and the second light sensing layer, the color separation elements being configured to direct light of the second wavelength band toward the second pixels and direct light of the third wavelength band toward the third pixels.

The first pixels of the first light sensing layer may be arranged in a two-dimensional array, and the second and third pixels of the second light sensing layer may be alternately arranged in a two-dimensional array.

The first to third pixels may have the same size, and the first light sensing layer and the second light sensing layer may be arranged such that boundaries of the first pixels may be aligned with boundaries of the second and third pixels.

The first light sensing layer and the second light sensing layer may be shifted relative to each other such that the first pixels may overlap portions of the second pixels and portions of the third pixels.

The second light sensing layer may include: first pixel rows in which a plurality of the second pixels and a plurality of the third pixels are alternately arranged in a first direction; and second pixel rows in which another plurality of the third pixels and another plurality of the second pixels are alternately arranged in the first direction, wherein the first and second pixel rows may be alternately arranged in a second direction perpendicular to the first direction.

The image sensor may further include a plurality of driving signal lines extending from the first light sensing layer to the second light sensing layer, which perform one of more of transmitting driving signals to the first light sensing layer and receiving data signals from the first light sensing layer.

The driving signal lines may be arranged outside main propagation paths of light separated by the color separation elements.

The driving signal lines may be arranged between the color separation elements in diagonal directions with respect to the color separation elements.

The driving signal lines may be arranged along interfaces between the first pixel rows and the second pixel rows.

The image sensor may further include trenches positioned between the second and third pixels, wherein the driving signal lines may extend from the first light sensing layer to the trenches positioned between the second and third pixels.

The color separation elements may be respectively positioned above the second pixels, and may be configured to direct the light of the second wavelength band in a straight downward direction towards the second pixels and the light of the third wavelength band toward both sides of the respective color separation element and towards the third pixels.

The color separation elements may be respectively positioned above the third pixels, and may be configured to direct the light of the third wavelength band in a straight downward direction toward the third pixels and the light of the second wavelength band toward both sides of the respective color separation elements toward the second pixels.

The color separation elements may be positioned to respectively face interfaces between the second and third pixels, and may be configured to direct the light of the second wavelength band toward a first peripheral side of the respective color separation element toward the respective second pixel and the light of the third wavelength band toward the other peripheral side, which is opposite the first peripheral side of the respective color separation element toward the respective third pixel.

The image sensor may further include a color filter layer, wherein the color filter layer may include: second color filters positioned on top of the second pixels and only transmitting the light of the second wavelength band; and third color filters positioned on top of the third pixels and only transmitting the light of the third wavelength band.

The image sensor may further include a transparent dielectric layer positioned between the first light sensing layer and the second light sensing layer, wherein the color separation elements may be buried in and fixed into the transparent dielectric layer.

The color separation elements may be formed of a material having a refractive index greater than that of the transparent dielectric layer.

According to another aspect of exemplary embodiment, an image pickup apparatus includes the image sensor such as the one described above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF EXEMPLARY EMBODIMENTS

Figure 1:
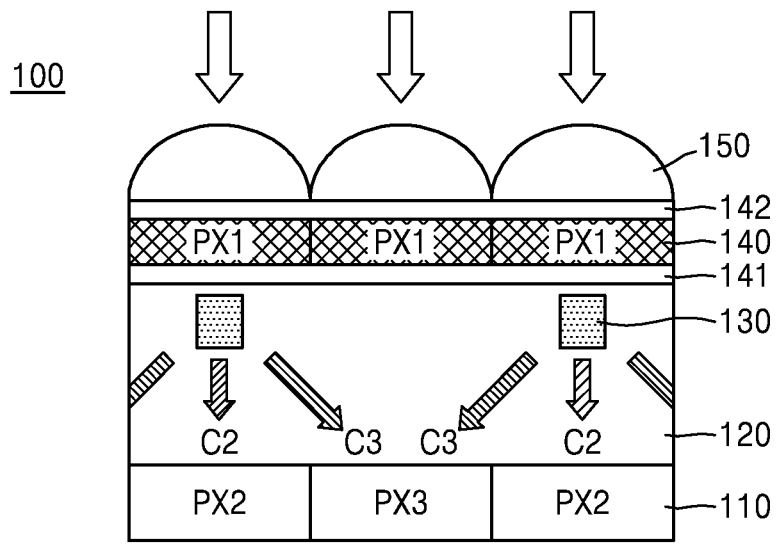
FIG. 1 is a cross-sectional view schematically illustrating the structure of an image sensor according to an exemplary embodiment.

Hereinafter, according to exemplary embodiments, a stacked type image sensor including a color separation element and an image pickup apparatus including the image sensor will be described in detail with reference to the accompanying drawings. In the drawings, like reference numbers refer to like elements, and also the size of each element may be exaggerated for clarity of illustration. Exemplary embodiments described herein are for illustrative purposes only, and various modifications may be made therefrom. In the following description of exemplary embodiments, when an element is referred to as being "above" or "on" another element in a layered structure, it may be directly on the other element while making contact with the other element or may be above the other element without making contact with the other element.

FIG. 1 is a view schematically illustrating a structure of an image sensor 100 according to an exemplary embodiment. Referring to FIG. 1, the image sensor 100 of an exemplary embodiment may include a first light sensing layer 140 including a plurality of first pixels Px1 absorbing and detecting light of a first wavelength band and transmitting light of other wavelength bands, a second light sensing layer 110 including a plurality of second pixels Px2 detecting light of a second wavelength band and a plurality of third pixels Px3 detecting light of a third wavelength band, and color separation elements 130 may be positioned between the first light sensing layer 140 and the second light sensing layer 110. The color separation elements 130 may direct a second wavelength band of light passed through the first light sensing layer 140 toward the second pixels Px2 of the second light sensing layer 110, and a third wavelength band of the light passed through the first light sensing layer 140 toward the third pixels Px3 of the second light sensing layer 110, in an exemplary embodiment.

In addition, the image sensor 100 may further include a transparent dielectric layer 120 positioned between the first light sensing layer 140 and the second light sensing layer 110, a first transparent electrode 141 and a second transparent electrode 142, respectively positioned on a lower surface and an upper surface of the first light sensing layer 140, and a plurality of microlenses 150 positioned on top of or above the second transparent electrode 142. The color separation elements 130 may be buried and fixed in the transparent dielectric layer 120. The first transparent electrode 141 and the second transparent electrode 142 apply a driving voltage to the first light sensing layer 140 and may be formed of, for example, a transparent conductive oxide such as indium tin oxide (ITO), indium zinc oxide (IZO), aluminum zinc oxide (AZO), or gallium zinc oxide (GZO), in an exemplary embodiment.

The first light sensing layer 140 and the second light sensing layer 110 may be stacked as shown in FIG. 1 in an exemplary embodiment. In detail, the transparent dielectric layer 120 may be positioned directly or indirectly above or on an upper surface of the second light sensing layer 110, and the first light sensing layer 140 may be positioned directly or indirectly above or on an upper surface of the transparent dielectric layer 120, parallel to the second light sensing layer 110 such that the transparent dielectric layer 120 is sandwiched between the first light sensing layer 140 and the second light sensing layer 110. In this case, in an exemplary embodiment, the first light sensing layer 140 and the second light sensing layer 110 may be configured to detect different wavelength bands of light. Particularly, the first light sensing layer 140 may absorb only light of a first wavelength band to be detected and may transmit light of second and third wavelength bands.

Figure 2A:
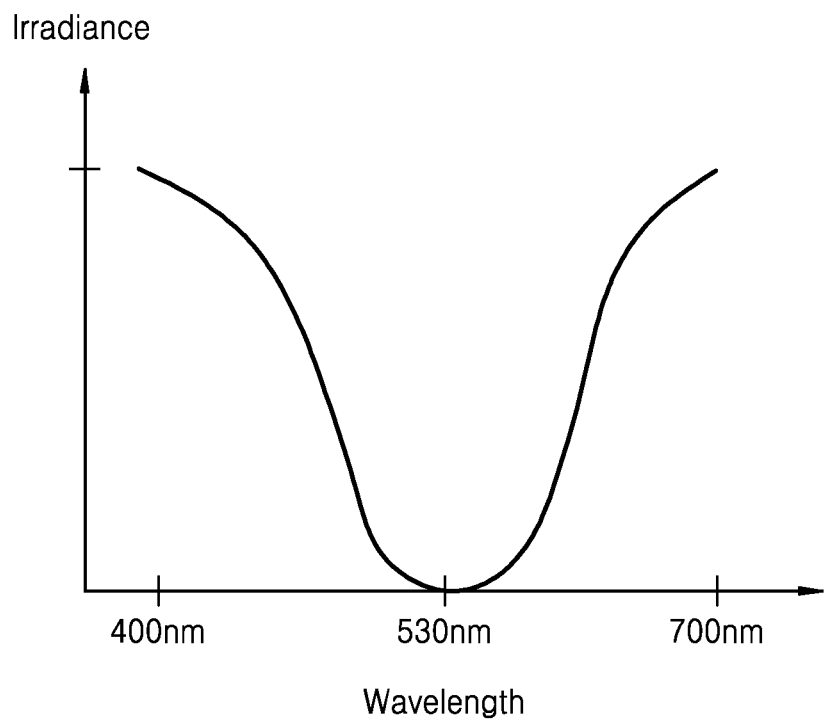
FIG. 2A is a graph illustrating a transmission spectrum of a first light sensing layer of an image sensor according to an exemplary embodiment.

For example, the first light sensing layer 140 may absorb only light of a green wavelength band and may transmit light of red and blue wavelength bands according to an exemplary embodiment. In an exemplary embodiment, FIG. 2A is a graph illustrating an exemplary transmission spectrum of a first light sensing layer such as the first light sensing layer 140 of the image sensor 100 illustrated in FIG. 1. Referring to the graph in FIG. 2A, the first light sensing layer 140 may transmit most blue light in a 400-nm wavelength band and most red light in a 700-nm wavelength band, but may absorb most green light in a 530-nm wavelength band. According to an exemplary embodiment, the first light sensing layer 140 having the above-described exemplary characteristics may include a material such as rhodamine-based pigment, a merocyanine-based pigment, or quinacridone.

In an exemplary embodiment, however, the absorption wavelength band of the first light sensing layer 140 is not limited to a green wavelength band. Alternatively, the first light sensing layer 140 may only absorb and detect light of a red wavelength band and may transmit light of blue and green wavelength bands. Alternatively, the first light sensing layer 140 may only absorb light of a blue wavelength band and may transmit light of green and red wavelength bands. For example, the first light sensing layer 140 may include a phthalocyanine-based pigment to detect light of a green wavelength band, or may include a material such as a coumarin-based pigment, tris-(8-hydroxyquinoline)aluminum (Alq3), or a merocyanine-based pigment to detect light of a blue wavelength band. For illustrative purposes only, the following description of exemplary embodiments will be presented under the assumption that the first light sensing layer 140 only absorbs and detects light of a green wavelength band and transmits light of red and blue wavelength bands.

As described above, according to an exemplary embodiment, since a first wavelength band of light incident on the image sensor 100 is absorbed by the first light sensing layer 140, only second and third wavelength bands of the light may be transmitted through the first light sensing layer 140. After passing through the first light sensing layer 140, the second and third wavelength bands of the light may be incident on the transparent dielectric layer 120 and then may be separated by the color separation elements 130. The color separation elements 130 are positioned at a light entrance side of the second light sensing layer 110 to separate incident light according to the wavelength thereof so that different wavelengths of the incident light may enter different pixels. The color separation elements 130 may separate colors of incident light thereon by changing the propagation direction of the incident light according to the wavelength of the incident light based on the diffraction or refraction characteristics of light varying according to the wavelength of the light. For this, the color separation elements 130 may be formed of a material having a refractive index greater than that of the transparent dielectric layer 120 surrounding the color separation elements 130 according to an exemplary embodiment. For example, the transparent dielectric layer 120 may be formed of $SiO_2$ or siloxane-based spin-on-glass (SOG), and the color separation elements 130 may be formed of a material having a high refractive index such as $TiO_2$, $SiN_3$, ZnS, ZnSe, or $Si_3N_4$. Various structures such as a transparent symmetric or asymmetric bar structure or a prism structure having a slope are known in the related art as structures for color separation elements. Thus, the structure of the color separation elements 130 may be variously designed according to desired spectrum distributions of exiting light and are within the scope of exemplary embodiments.

As shown in FIG. 1, the color separation elements 130 may divide incident light thereon into light C2 of a second wavelength band and light C3 of a third wavelength band, according to an exemplary embodiment. For example, the color separation elements 130 may not change the propagation direction of the light C2 of the second wavelength band and may change the propagation direction of the light C3 of the third wavelength band toward lateral sides thereof. Then, the light C2 of the second wavelength band may be incident on the second pixels Px2 located under the color separation elements 130, and the light C3 of the third wavelength band may be incident on the third pixels Px3 located at lateral sides of the color separation elements 130, according to an exemplary embodiment. Therefore, the second pixels Px2 located under the color separation elements 130 may detect the light C2 of the second wavelength band, and the third pixels Px3 located at lateral sides of the color separation elements 130 may detect the light C3 of the third wavelength band, in an exemplary embodiment.

Figure 2B:
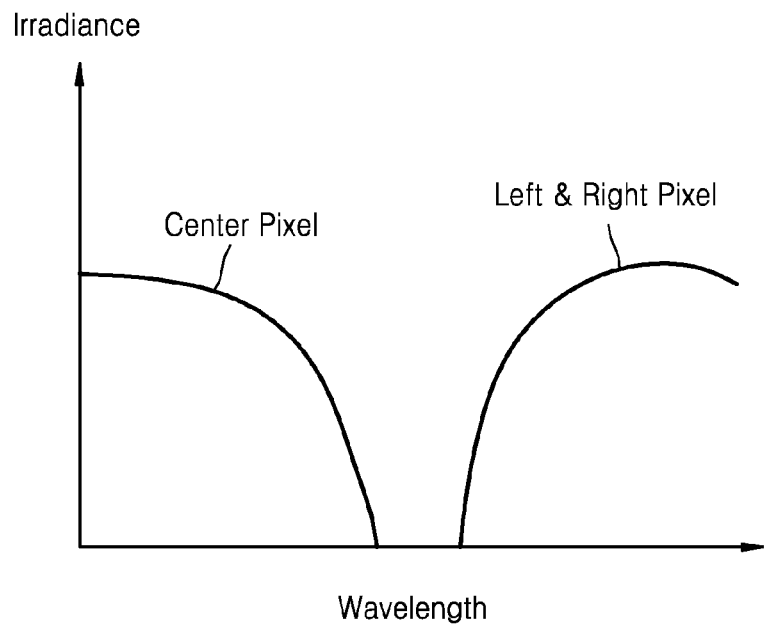
FIG. 2B is a graph illustrating a color-separation spectrum of color separation elements of an image sensor according to an exemplary embodiment.

For example, the light C2 of the second wavelength band may be blue light, and the light C3 of the third wavelength band may be red light. FIG. 2B is a graph illustrating an exemplary color-separation spectrum of a color separation elements such as the color separation elements 130 of the image sensor 100 illustrated in FIG. 1, according to an exemplary embodiment. As shown in FIG. 2B, the color separation elements 130 may separate light of a blue wavelength band and light of a red wavelength band by directing light of the blue wavelength band in a straight downward direction and directing light of the red wavelength band toward left and right sides thereof. In this way, in an exemplary embodiment, the first light sensing layer 140 may absorb and detect green light, and the second light sensing layer 110 may detect blue and red light transmitted through the first light sensing layer 140.

Figure 3:
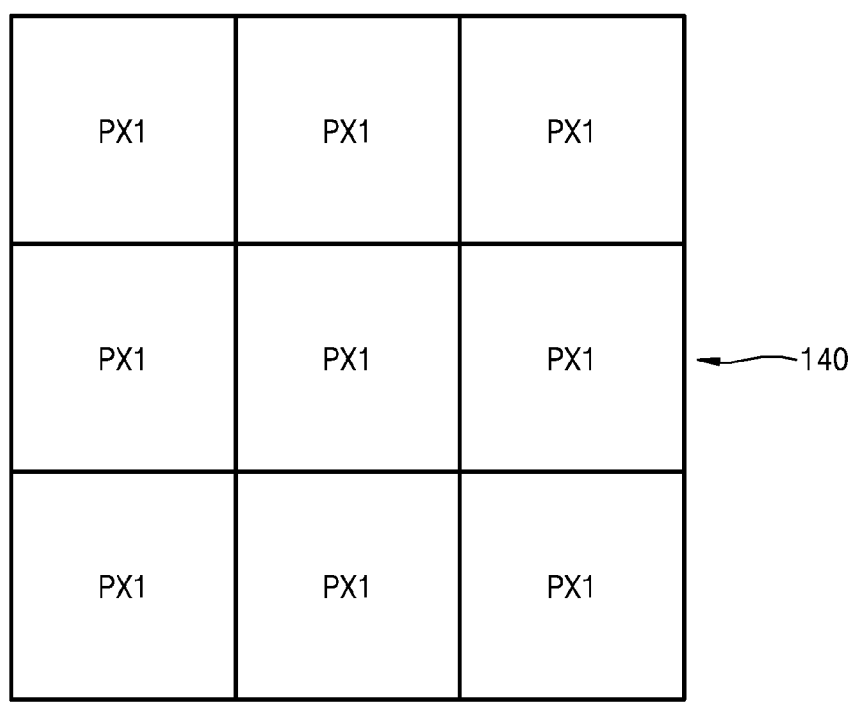
FIG. 3 is a view schematically illustrating a pixel structure of a first light sensing layer of an image sensor according to an exemplary embodiment.
Figure 4:
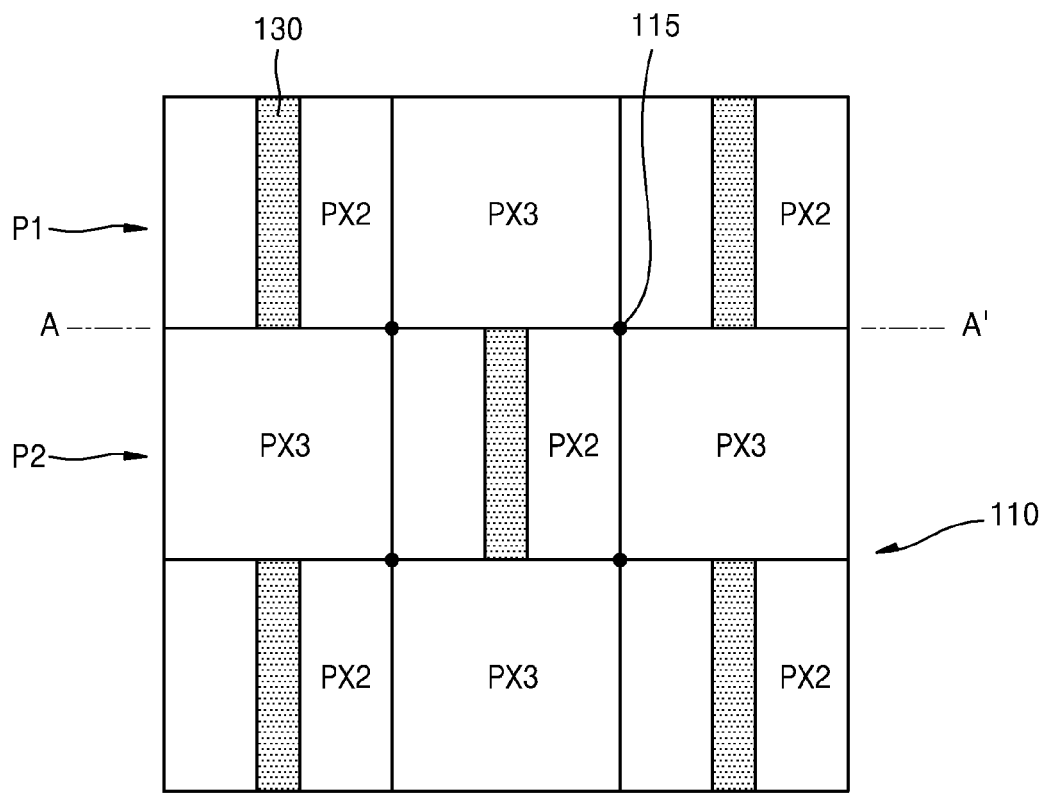
FIG. 4 is a view schematically illustrating a pixel structure of a second light sensing layer of an image sensor according to an exemplary embodiment.

In an exemplary embodiment, the first pixels Px1 of the first light sensing layer 140 and the second and third pixels Px2 and Px3, respectively, may have the same size. For example, FIG. 3 is a view schematically illustrating a pixel structure of a first light sensing layer such as the light sensing layer 140 of the image sensor 100, according to an exemplary embodiment, and FIG. 4 is a view schematically illustrating a pixel structure of a second light sensing layer such as the second light sensing layer 110 of the image sensor 100 according to an exemplary embodiment. Referring to FIGS. 3 and 4, the first pixels Px1 of the first light sensing layer 140 may be arranged in a two-dimensional array structure, and the second pixels Px2 and the third pixels Px3 of the second light sensing layer 110 may be arranged in a two-dimensional array structure. The first pixels Px1 of the first light sensing layer 140 may match the second and third pixels Px2 and Px3 of the second light sensing layer 110 in such a manner that boundaries of the first pixels Px1 are aligned with boundaries of the second and third pixels Px2 and Px3, according to an exemplary embodiment.

In addition, referring to FIG. 4, according to an exemplary embodiment, the second and third pixels Px2 and Px3 of the second light sensing layer 110 may be alternately arranged in rows and columns. For example, the second light sensing layer 110 may include first pixel rows P1 in which a plurality of second pixels Px2 and a plurality of third pixels Px3 are alternately arranged in the order of second and third pixels Px2 and Px3, and second pixel rows P2 in which a plurality of third pixels Px3 and a plurality of second pixels Px2 are alternately arranged in the order of third and second pixels Px3 and Px2. The first pixel rows P1 and the second pixel rows P2 may be alternately arranged in a vertical direction, according to an exemplary embodiment. The color separation elements 130 may be positioned to face the second pixels Px2. Therefore, the color separation elements 130 may provide light C2 of a second wavelength band for the second pixels Px2, and light C3 of a third wavelength band for the third pixels Px3 which may be positioned at left and right sides thereof.

Referring to FIG. 4, the image sensor 100 may further include driving signal lines 115 to transmit driving signals to the first light sensing layer 140 or receive data signals from the first light sensing layer 140, according to an exemplary embodiment. A driving circuit (not shown in the cross-sectional view of FIG. 1) may be positioned below or under the second light sensing layer 110 so as to control operations of the first light sensing layer 140 and the second light sensing layer 110 and process data received from the first light sensing layer 140 and the second light sensing layer 110. Therefore, the driving signal lines 115 may penetrate the second light sensing layer 110 and the transparent dielectric layer 120 to connect the driving circuit positioned below or under the second light sensing layer 110 to the first light sensing layer 140.

Figure 5:
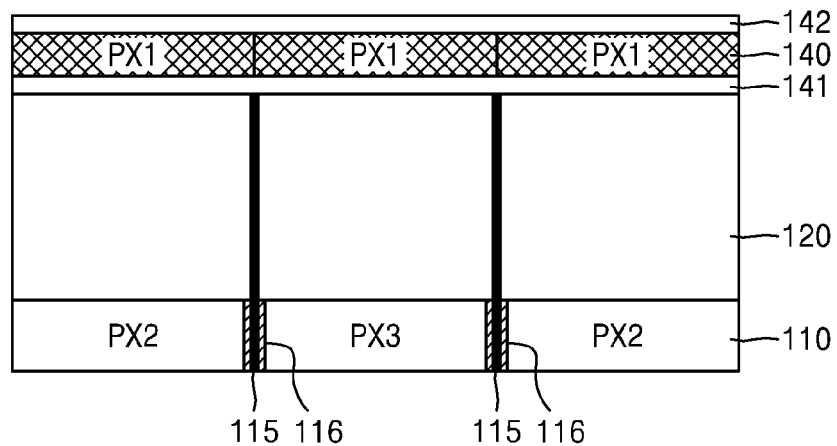
FIG. 5 is a schematic cross-sectional view of a second light sensing layer along line A-A' such as the second light sensing layer of FIG. 4, according to an exemplary embodiment.

For example, FIG. 5 is a schematic cross-sectional view of a second light sensing layer such as the second light sensing layer 100 taken along line A-A' of FIG. 4, according to an exemplary embodiment. Referring to FIG. 5, the driving signal lines 115 may extend between the second and third pixels Px2 and Px3 of the second light sensing layer 110 to the first light sensing layer 140 through the transparent dielectric layer 120. Trenches may be formed among the second and third pixels Px2 and Px3 to separate the second and third pixels Px2 and Px3, and the driving signal lines 115 may be positioned in the trenches between the second and third pixels Px2 and Px3. Also, the driving signal lines 115 may be surrounded by insulation films 116 to separate the trenches from the second and third pixels Px2 and Px3.

According to the positions of the driving signal lines 115 in an exemplary embodiment, light C3 of a third wavelength band that propagates toward the left and right sides of the color separation elements 130 may be interfere with the driving signal lines 115 or may be blocked or changed in direction by the driving signal lines 115. To prevent this, the driving signal lines 115 may be placed at positions so as not to obstruct the propagation of light separated by the color separation elements 130. That is, the driving signal lines 115 may be positioned outside main propagation paths of light separated by the color separation elements 130. For example, as shown in FIG. 4, the driving signal lines 115 may be positioned at vertexes of the second and third pixels Px2 and Px3. That is, according to an exemplary embodiment, the driving signal lines 115 may be positioned among the color separation elements 130 in diagonal directions of the color separation elements 130. However, the positions of the driving signal lines 115 are not limited thereto and are provided by way of an example only. That is, the driving signal lines 115 may be placed at any positions as long as the propagation of light separated by the color separation elements 130 is not obstructed. For example, if the light separated by the color separation elements 130 propagates toward the left and right sides of the color separation elements 130, the driving signal lines 115 may be placed at any positions along interfaces between the first and second pixel rows P1 and P2 extending in a horizontal direction.

According to an exemplary embodiment, since the first light sensing layer 140 and the second light sensing layer 110 of the image sensor 100 are arranged in a stacked manner, the number of pixels per area may be increased. Therefore, the resolution of the image sensor 100 may be improved. Furthermore, the first light sensing layer 140 absorbs and detects most of the light of a first wavelength band. Also, the light of second and third wavelength bands separated by the color separation elements 130 are detected by the second light sensing layer 110 almost without a loss. Therefore, according to an exemplary embodiment, the light of the first to third wavelength bands may be efficiently used. Therefore, according to an exemplary embodiment, the sensitivity of the image sensor 100 may be improved in all wavelength bands. Furthermore, the color separation elements 130 may be configured to separate only two wavelength bands of light, and thus, the color separation elements 130 may be easily designed and manufactured. The image sensor 100 of an exemplary embodiment may be applied to various image pickup apparatuses for providing high-quality images. The image pickup apparatuses, according to an exemplary embodiment, may further include a display and a memory. The image pickup apparatuses may be a digital still camera or a digital video camera which has a sensor for picking up an image and hardware or a combination of hardware and software processor/controller which controls the storing/recording of the image into a memory and/or outputting the image onto a display. The image pickup apparatuses may further include a tangible user interface for user inputting commands. For example, the user interface may include a number of user buttons, which are manipulated by the user to capture, process, edit, and output images.

The structures of the first light sensing layer 140 and the second light sensing layer 110 of the image sensor 100 and the characteristics of the color separation elements 130 described with reference to FIGS. 1 to 5 are exemplary structures and characteristics, according to an exemplary embodiment. That is, image sensors having various structures other than those described with reference to FIGS. 1 to 5 may be provided in exemplary embodiments. For example, various color-separation characteristics may be obtained according to the design of the color separation elements 130, and the structure of the second light sensing layer 110 may be changed in various ways according to the design of the color separation elements 130. Furthermore, the relative arrangement of the first light sensing layer 140 and the second light sensing layer 110 may be altered in various ways.

Figure 6:
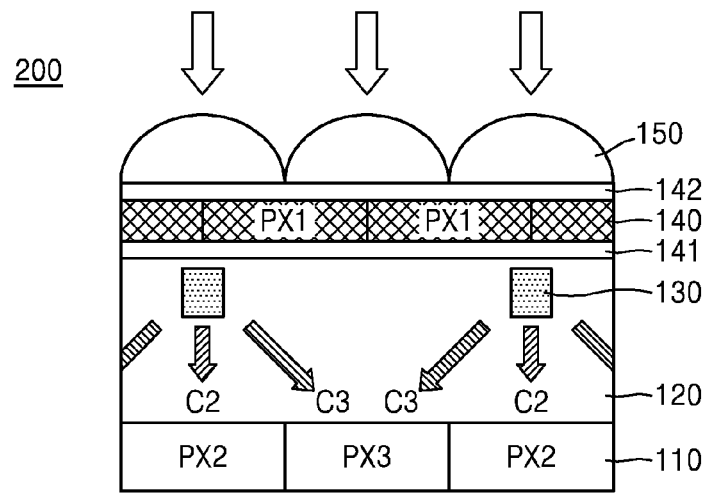
FIG. 6 is a cross-sectional view schematically illustrating a structure of an image sensor according to yet another exemplary embodiment.
Figure 7:
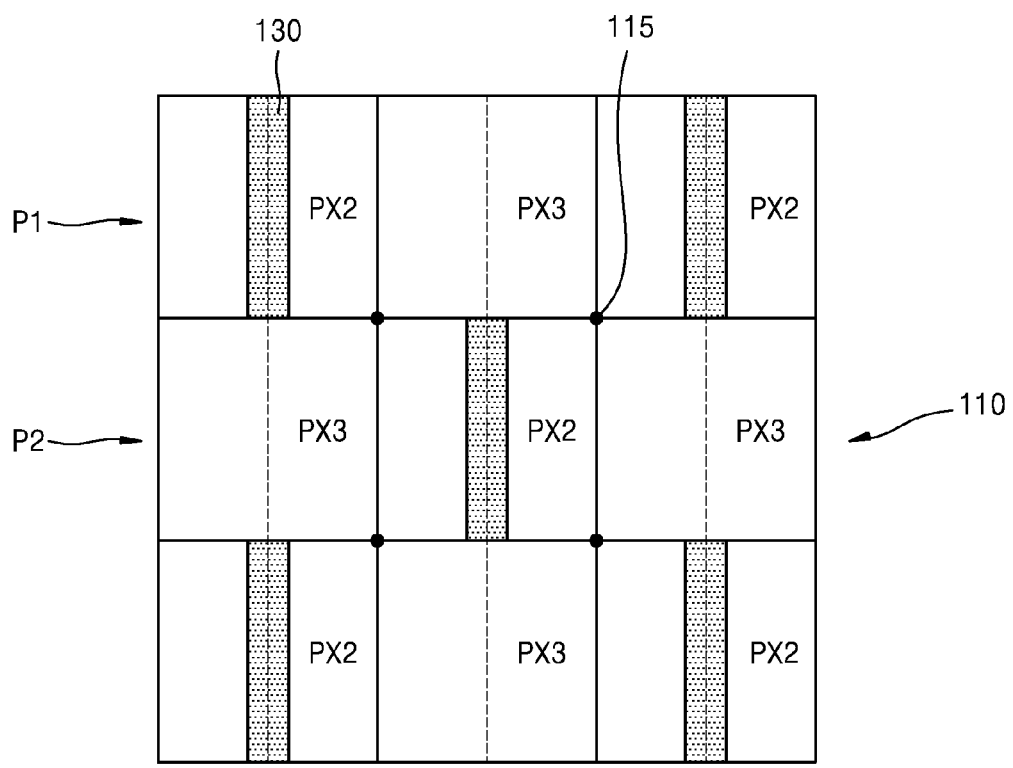
FIG. 7 is a view schematically illustrating a pixel structure of a second light sensing layer of an image sensor according to yet another exemplary embodiment.

FIG. 6 is a cross-sectional view schematically illustrating the structure of an image sensor according to yet another exemplary embodiment, and FIG. 7 is a plan view schematically illustrating a pixel structure of a second light sensing layer such as the second light sensing layer 110 of the image sensor 200, according to an exemplary embodiment. When compared to the image sensor 100 illustrated in FIG. 1, first and second light sensing layers 140 and 110 of the image sensor 200 illustrated in FIG. 6 are shifted relative to each other. For example, the first light sensing layer 140 may be shifted relative to the second light sensing layer 110 by ½ of a pixel width. Therefore, according to an exemplary embodiment, first pixels Px1 of the first light sensing layer 140 may range over halves of second and third pixels Px2 and Px3 of the second light sensing layer 110. Referring to the plan view of FIG. 7, the second light sensing layer 110 may have analogous pixel structure to the one illustrated in FIG. 4, according to an exemplary embodiment. However, as shown by dashed lines, the first pixels Px1 of the first light sensing layer 140 may overlap portions of the second pixels Px2 and portions of the third pixels Px3. Thus, the resolution of the image sensor 200 may be improved by analyzing color information of the overlapping portions according to an exemplary embodiment.

Figure 8:
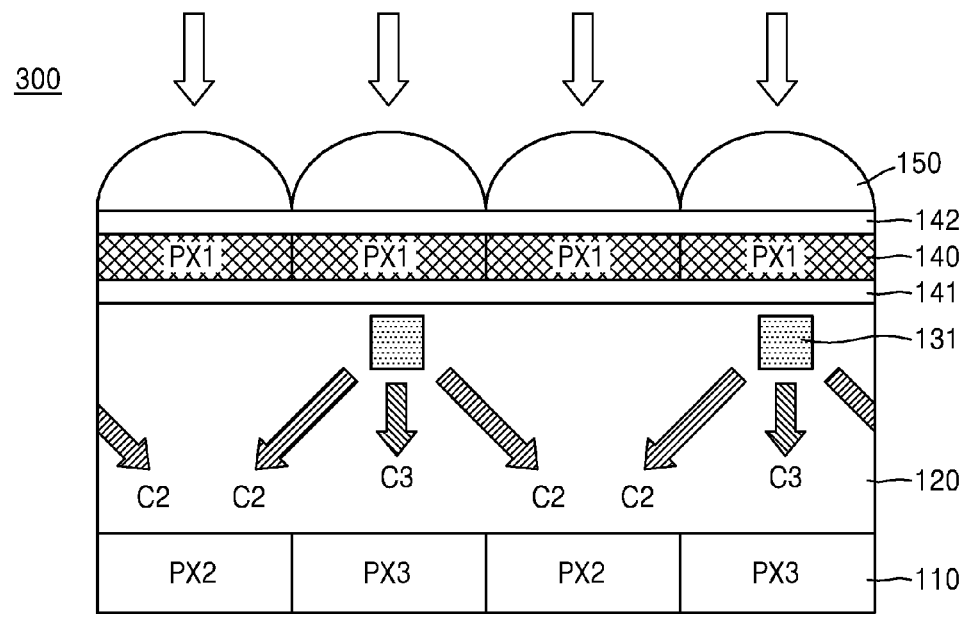
FIG. 8 is a cross-sectional view schematically illustrating a structure of an image sensor according to yet another exemplary embodiment.

FIG. 8 is a plan view schematically illustrating a structure of an image sensor according to yet another exemplary embodiment. In the image sensor 100 illustrated in FIG. 1, the color separation elements 130 are positioned to face the second pixels Px2 and are configured to direct light C2 of a second wavelength band in a straight downward direction and light C3 of a third wavelength band toward left and right sides thereof. However, according to yet another exemplary embodiment, the image sensor 300 illustrated in FIG. 8 may include color separation elements 131 configured to direct light C3 of a third wavelength band in a straight downward direction and light C2 of a second wavelength band toward left and right sides. In this case, according to an exemplary embodiment, the color separation elements 131 may be posited directly above third pixels Px3. For example, the color separation elements 131 may direct light of a red wavelength band in a straight downward direction (that is, toward the third pixels Px3) and light of a blue wavelength band toward left and right sides (that is, toward second pixels Px2). Other structures of the image sensor 300 may be the analogous to those of the image sensor 100 illustrated FIG. 1, according to an exemplary embodiment. The color separation elements 131 illustrated in FIG. 8, according to an exemplary embodiment, may be applied to the image sensor 200 illustrated in FIGS. 6 and 7, according to yet another exemplary embodiment.

Figure 9:
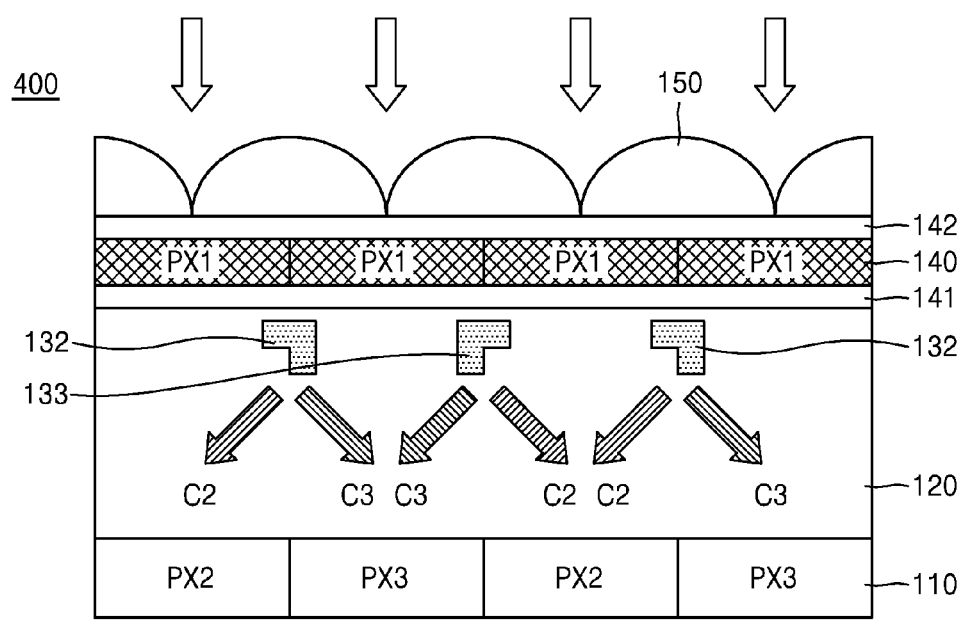
FIG. 9 is a cross-sectional view schematically illustrating a structure of an image sensor according to yet another exemplary embodiment.

FIG. 9 is a plan view schematically illustrating a structure of an image sensor according to yet another exemplary embodiment. The image sensor 400 illustrated in FIG. 9, according to yet another exemplary embodiment, may include first color separation elements 132 configured to direct light C2 of a second wavelength band toward left sides and light C3 of a third wavelength band toward right sides and second color separation elements 133 configured to direct light C3 of the third wavelength band toward left sides and light C2 of the second wavelength band toward right sides. In this case, the first and second color separation elements 132 and 133 may be alternately arranged to as an interface between second and third pixels Px2 and Px3 such that each of the second pixels Px2 is disposed at a left side of each of the first color separation elements 132 and at a right side of each of the second color separation elements 133 and each of the third pixels Px3 is disposed at a left side of each of the second color separation elements 133 and at a right side of each of the first color separation elements 132, as shown in FIG. 9. Therefore, according to an exemplary embodiment, light C2 of a second wavelength band separated by the first and second color separation elements 132 and 133 may be incident on the second pixels Px2, and light C3 of a third wavelength band separated by the first and second color separation elements 132 and 133 may be incident on the third pixels Px3. For example, the first and second separation elements 132 and 133 may have an asymmetric stepwise shape such that light C2 and light C3 are asymmetrically separated by the first and second separation elements 132 and 133. The first and second separation elements 132 and 133 may have an identical structure but may be disposed in opposite directions to each other. Each of the plurality of microlenses 150 may be disposed between two adjacent first pixels Px1 such that light converged by the microlenses 150 is incident on the first and second color separation elements 132 and 133. Other structures of the image sensor 400 illustrated FIG. 9 may be analogous to the ones of the image sensor 100 illustrated FIG. 1, according to an exemplary embodiment. The color separation elements 132 illustrated in FIG. 9 may be applied to the image sensor 200 illustrated in FIGS. 6 and 7, according to yet another exemplary embodiment.

Other color separation elements having various characteristics may be used, and the arrangement of the first light sensing layer 140 and the second light sensing layer 110 may vary according to the color-separation characteristics of the color separation elements.

The distance between the color separation elements 130, 131, or 132 and the second light sensing layer 110 may be several micrometers or shorter, for example, 1 micrometer or shorter, according to various exemplary embodiments. Since the distance between the color separation elements 130, 131, or 132 and the second light sensing layer 110 is short, colors may not be fully separated in some cases. Thus, color filters may additionally be used to reduce the possibility of color mixing and improve color reproducibility, according to an exemplary embodiment.

Figure 10:
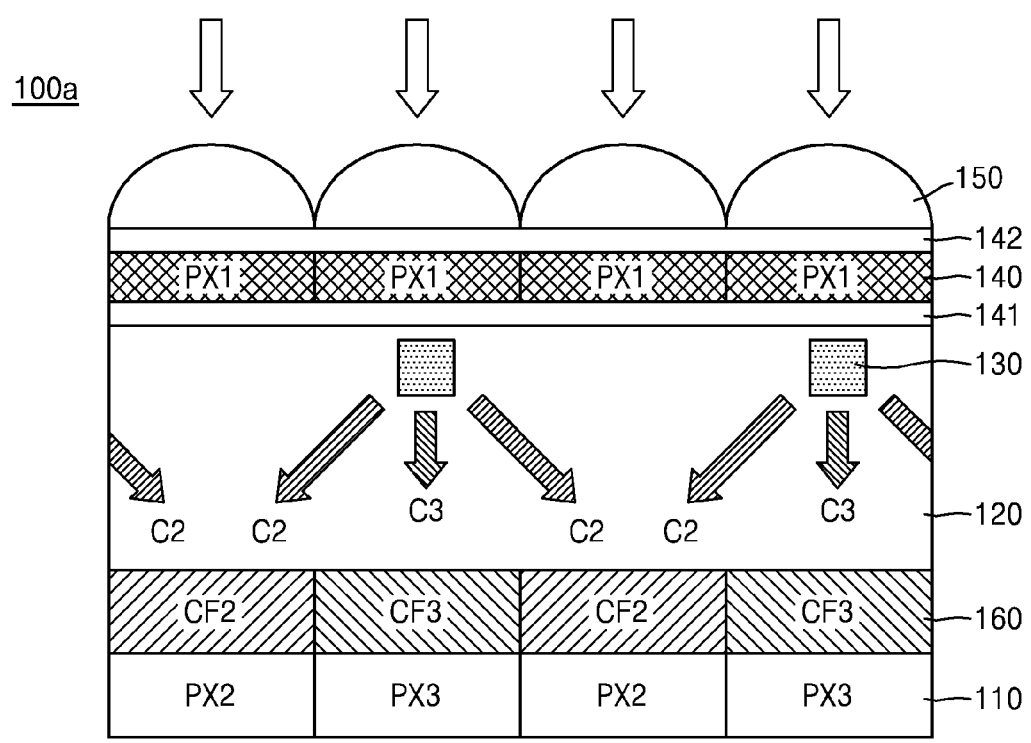
FIG. 10 is a cross-sectional view schematically illustrating a structure of an image sensor according to yet another exemplary embodiment.
Figure 11:
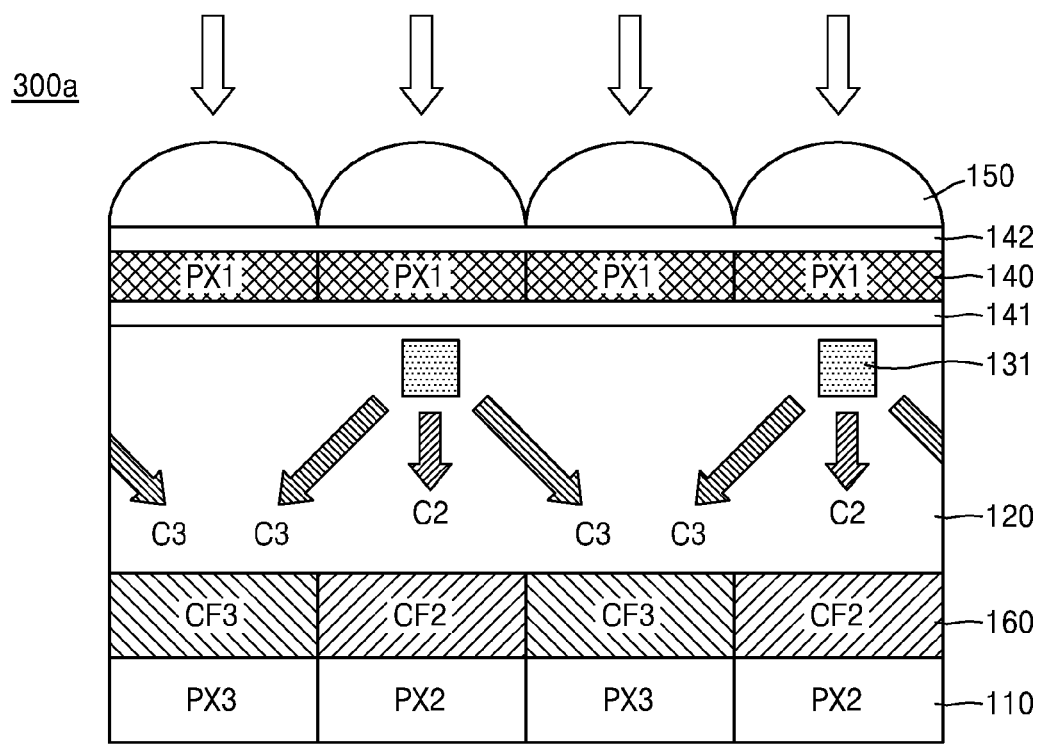
FIG. 11 is a cross-sectional view schematically illustrating a structure of an image sensor according to yet another exemplary embodiment.
Figure 12:
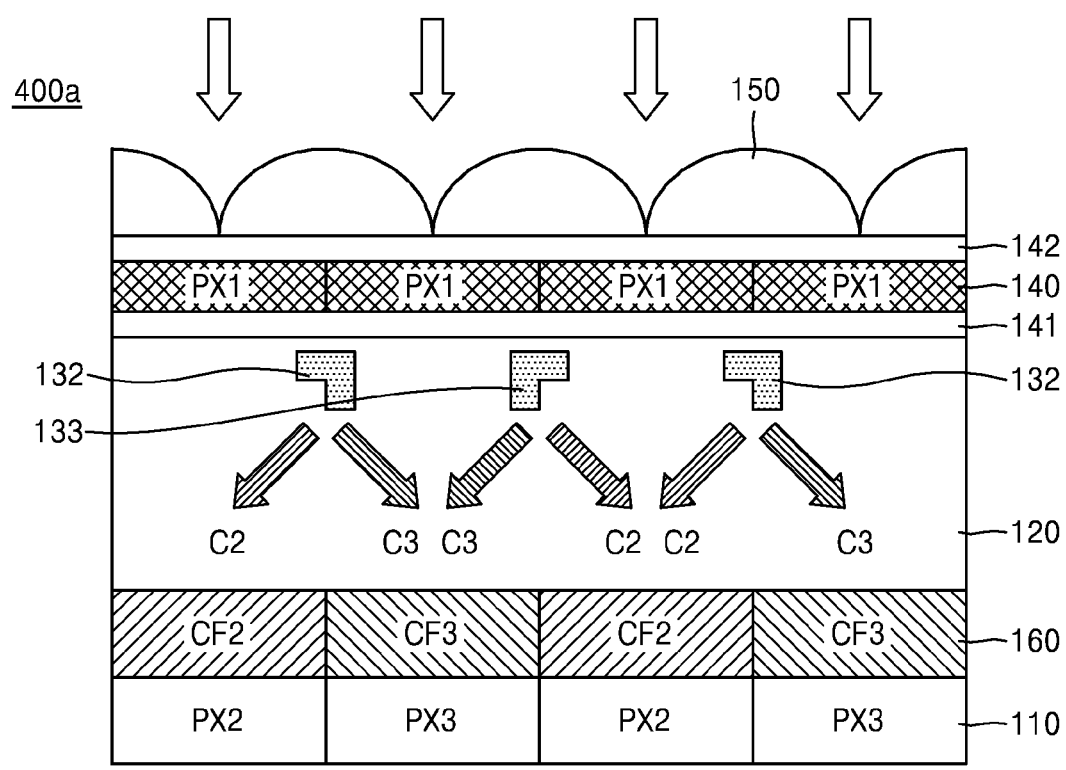
FIG. 12 is a cross-sectional view schematically illustrating a structure of an image sensor according to yet another exemplary embodiment.

For example, FIGS. 10 to 12 are cross-sectional view schematically illustrating image sensors 100a, 300a, and 400a including additional color filters according to yet other exemplary embodiments. The image sensor 100a illustrated in FIG. 10 further includes a color filter layer 160, some of other components are analogous to the components of the image sensor 100 illustrated in FIG. 1, according to an exemplary embodiment. The image sensor 300a illustrated in FIG. 11 further includes a color filter layer 160, some of other components are analogous to the components of the image sensor 300 illustrated in FIG. 8, according to an exemplary embodiment. The image sensor 400a illustrated in FIG. 12 further includes a color filter layer 160, some of other components are analogous to the components of the image sensor 400 illustrated in FIG. 9, according to an exemplary embodiment. In each case, according to various exemplary embodiments, the color filter layer 160 may be positioned on top of a second light sensing layer 110. For example, the color filter layer 160 may include second color filters CF2 positioned on top of second pixels Px2 and transmitting only light C2 of a second wavelength band, and third color filters CF3 positioned on top of third pixels Px3 and transmitting only light C3 of a third wavelength band. Although the color filter layer 160 is used, since light C2 and light C3 significantly separated by the color separation elements 130, 131, or 132 are incident on the color filters CF2 and CF3, optical loss caused by the color filter layer 160 may not be large. Therefore, the image sensors 100a, 300a, and 400a illustrated in FIGS. 10 to 12 may have high light use efficiency and color reproducibility, according to an exemplary embodiment.

The stacked type image sensor including the color separation elements and the image pickup apparatus including the image sensor have been described according to various exemplary embodiments with reference to the accompanying drawings. However, it should be understood that the exemplary embodiments described herein are to be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims and their equivalents.

What is claimed is:

1. An image sensor comprising:
a first light sensing layer comprising a plurality of first pixels absorbing light of a first wavelength band and transmitting light of other wavelength bands;
a second light sensing layer positioned to face the first light sensing layer, wherein the second light sensing layer comprises a plurality of second pixels detecting light of a second wavelength band from the transmitted other wavelength bands and a plurality of third pixels detecting light of a third wavelength band from the transmitted other wavelength bands; and
a plurality of color separation elements positioned between the first light sensing layer and the second light sensing layer,
wherein the color separation elements are configured to direct light of the second wavelength band toward the second pixels and direct light of the third wavelength band toward the third pixels.

2. The image sensor of claim 1, wherein the first pixels of the first light sensing layer are arranged in a two-dimensional array, and wherein the second and third pixels of the second light sensing layer are alternately arranged in a two-dimensional array.

3. The image sensor of claim 2, wherein the first, second, and third pixels have same size, and wherein the first light sensing layer and the second light sensing layer are arranged such that boundaries of the first pixels are aligned with boundaries of the second and third pixels.

4. The image sensor of claim 2, wherein the first light sensing layer and the second light sensing layer are shifted relative to each other such that the first pixels overlap portions of the second pixels and portions of the third pixels.

5. The image sensor of claim 1, wherein the second light sensing layer comprises:
first pixel rows in which a plurality of the second pixels and a plurality of the third pixels are alternately arranged in a first direction; and
second pixel rows in which another plurality of the third pixels and another plurality of the second pixels are alternately arranged in the first direction,
wherein the first and second pixel rows are alternately arranged in a second direction perpendicular to the first direction.

6. The image sensor of claim 5, further comprising: a plurality of driving signal lines extending from the first light sensing layer to the second light sensing layer, wherein the plurality of signal lines are configured to perform at least one of: transmit driving signals to the first light sensing layer and receive data signals from the first light sensing layer.

7. The image sensor of claim 6, wherein the driving signal lines are positioned outside main propagation paths of light separated by the color separation elements.

8. The image sensor of claim 7, wherein the driving signal lines are arranged between the color separation elements in diagonal directions with respect to the color separation elements.

9. The image sensor of claim 7, wherein the driving signal lines are arranged along interfaces between the first pixel rows and the second pixel rows.

10. The image sensor of claim 6, further comprising: trenches positioned between the second and third pixels, wherein the driving signal lines extend from the first light sensing layer to the trenches that are positioned between the second and third pixels.

11. The image sensor of claim 1, wherein the color separation elements are provided above the second pixels, and wherein the color separation elements are configured to direct light of the second wavelength band in a straight downward direction towards the second pixels and light of the third wavelength band toward both sides of the respective color separation element and towards the third pixels.

12. The image sensor of claim 1, wherein the color separation elements are positioned above the third pixels, and are configured to direct light of the third wavelength band in a straight downward direction toward the third pixels and light of the second wavelength band toward both sides of the respective color separation elements toward the second pixels.

13. The image sensor of claim 1, wherein the color separation elements are face interfaces between the second and third pixels, and are configured to direct light of the second wavelength band toward a first peripheral side of the respective color separation element toward the respective second pixel and light of the third wavelength band toward the other peripheral side, which is opposite to the first peripheral side, of the respective color separation element toward the respective third pixel.

14. The image sensor of claim 1, further comprising a color filter layer, wherein the color filter layer comprises:
second color filters positioned on top of the second pixels and only transmitting light of the second wavelength band; and
third color filters positioned on top of the third pixels and only transmitting light of the third wavelength band.

15. The image sensor of claim 1, further comprising: a transparent dielectric layer positioned between the first light sensing layer and the second light sensing layer, wherein the color separation elements are buried in and fixed into the transparent dielectric layer.

16. The image sensor of claim 15, wherein the color separation elements are formed of a material having a refractive index greater than a refractive index of the transparent dielectric layer.

17. An image pickup apparatus comprising: an image sensor, which comprises:
a first light sensing layer comprising a plurality of first pixels absorbing light of a first wavelength band and transmitting light of other wavelength bands;
a second light sensing layer positioned to face the first light sensing layer, wherein the second light sensing layer comprises a plurality of second pixels detecting light of a second wavelength band from the transmitted other wavelength bands and a plurality of third pixels detecting light of a third wavelength band from the transmitted other wavelength bands; and
a plurality of color separation elements positioned between the first light sensing layer and the second light sensing layer,
wherein the color separation elements are configured to direct light of the second wavelength band toward the second pixels and direct light of the third wavelength band toward the third pixels.

18. The image pickup apparatus of claim 17, wherein the color separation elements comprise different types of color separation elements which direct light differently from each other.

19. The image pickup apparatus of claim 18, wherein:
a first type of the color separation elements transmit the light of the second wavelength band to a first peripheral direction with respect to the respective color separation element and transmit the light of the third wavelength band to a second peripheral direction with respect to the respective color separation element, a second type of the color separation elements transmit the light of the second wavelength band to the second peripheral direction with respect to the respective color separation element and transmit the light of the third wavelength band to the first peripheral direction with respect to the respective color separation element, and wherein the first peripheral direction is opposite of the second peripheral direction.

20. The image pickup apparatus of claim 18, wherein the image sensor comprises alternating one of said first type of the color separation elements and one of said second type of the color separation elements.

\* \* \* \* \*